United States Patent [19]

Peel

[11] Patent Number: 4,577,394
[45] Date of Patent: Mar. 25, 1986

[54] REDUCTION OF FIELD OXIDE ENCROACHMENT IN MOS FABRICATION

[75] Inventor: John L. Peel, Sandy, Utah

[73] Assignee: National Semiconductor Corporation, Santa Clara, Calif.

[21] Appl. No.: 655,810

[22] Filed: Oct. 1, 1984

[51] Int. Cl.⁴ .................. H01L 21/76; H01L 21/316
[52] U.S. Cl. .................. 29/576 W; 148/DIG. 85; 148/DIG. 86; 148/DIG. 133; 357/50; 29/578
[58] Field of Search .................. 29/571, 576 W, 578; 148/DIG. 85, DIG. 86, DIG. 133, 1.5; 357/47, 49, 50, 53, 54; 427/94

[56] References Cited

U.S. PATENT DOCUMENTS 4,272,308  6/1981  Varshney .................. 29/576 W X
4,407,851  10/1983  Kurosawa et al. .................. 427/39
4,418,094  11/1983  See et al. .................. 427/38

OTHER PUBLICATIONS

Warren, M. J. "Field-Implant Spacer for Isolation Devices" in *IBM Technical Disclosure Bulletin*, 27(6), 11-1984, p. 3245.

Primary Examiner—Brian E. Hearn
Assistant Examiner—Alan E. Schiavelli
Attorney, Agent, or Firm—Gail W. Woodward; Paul J. Winters; Michael J. Pollock

[57] ABSTRACT

Reduction of the encroachment of a grown field oxide layer during MOS device fabrication by covering a masking anti-oxidant layer that defines the active element area of a semiconductor substrate with a layer of passivation material which extends over the edge of the anti-oxidant layer to contact the pad oxide over the semiconductor substrate surface.

10 Claims, 6 Drawing Figures

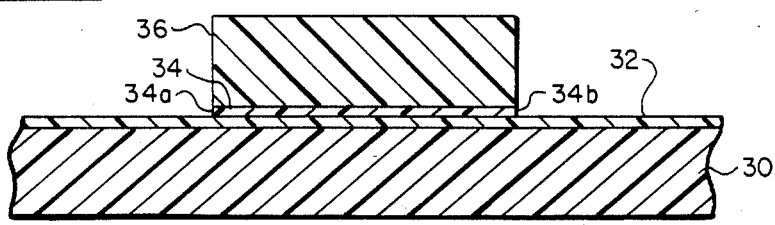
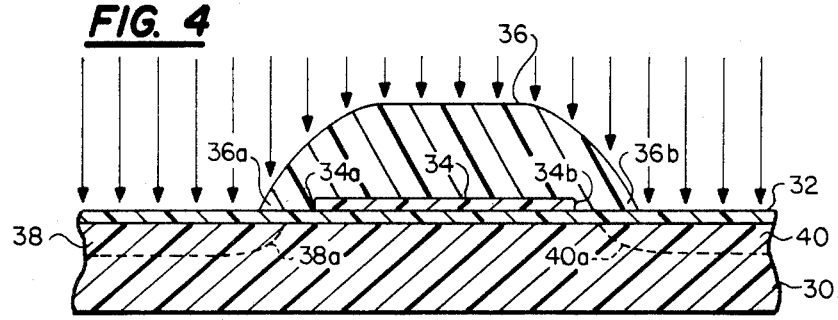
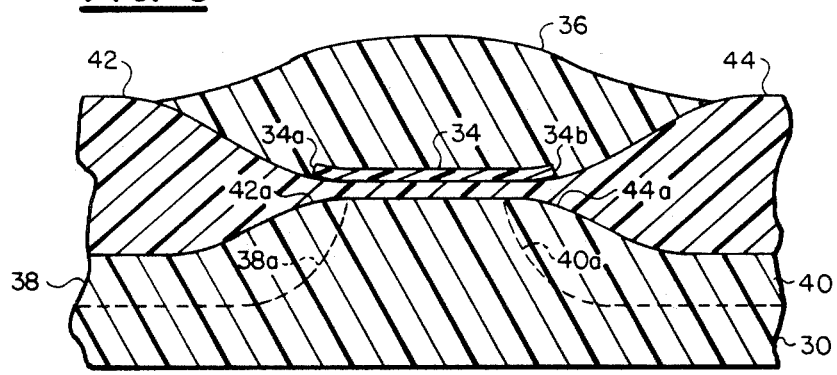
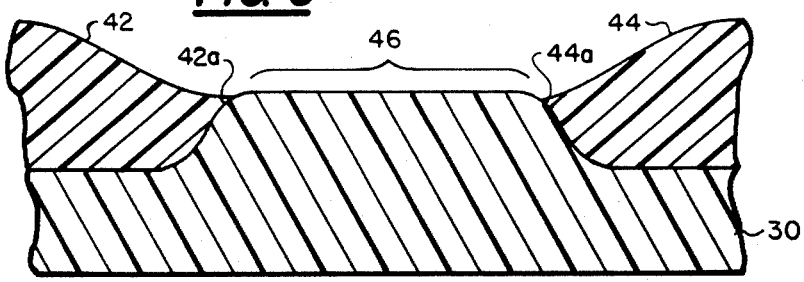

REDUCTION OF FIELD OXIDE ENCROACHMENT IN MOS FABRICATION

BACKGROUND OF THE INVENTION

The present invention relates to a method for reducing the encroachment of a field oxide layer which is grown during the fabrication of a MOS device on a semiconductor substrate by means of a self-aligned process.

The fabrication of MOS semiconductor devices on a silicon substrate by means of a self-aligned process includes the growth of a thick field oxide layer on the surface of the substrate between the substrate active areas in which the devices are to be fabricated. The field oxide enhances the operational isolation between the elements by suppressing various parasitic mechanisms.

In the well-known LOCOS method of MOS device fabrication, a layer of anti-oxidant material is laid down over a relatively thin pad oxide layer formed on a silicon substrate and etched into a mask which prevents the growth of field oxide over the masked active region of the substrate. When the anti-oxidant mask is in place, the field region of the substrate surface outside the anti-oxidant mask is first doped with field impurity and then subjected to a processing step during which a relatively thick layer of field oxide is grown.

As is known, the field oxidation step results in the encroachment of the thin end of a wedge-shaped portion of the oxide layer between the edge of the anti-oxidant mask and the underlying thin pad oxide layer. This lateral diffusion of the field oxide between the mask and the substrate is also called a "bird's-beak" region. As is known, the bird's-beak encroachment reduces the total active area available for the following lithographic process by which the active element is formed in the active region, and causes the formation of stress or stacking faults that can result in the propagation of defects in subsequently-formed layers during fabrication of the element. Further, the relatively high time-temperature product of the field oxidation process permits the field impurities to diffuse beneath the element area; this diffusion can reduce the operational voltage threshold of the fabricated device and increase the device's parasitic capacitance.

One method for reducing field oxide encroachment is to grow a relatively thick layer of anti-oxidant material to mask the active element area of the substrate. However, the thick mask distorts the crystal structure of the underlying substrate abutting the edge of the mask, which can result in the propagation of imperfections through crystals which are later grown in the same area.

Another method of resisting field oxide encroachment includes the formation of a notch in the substrate adjacent the mask edge. The notch is filled with a material forming a barrier against the growth of field oxide between the mask and the substrate. Still another method of resisting encroachment is to lay down the field oxide before definition of the active element area in the substrate and then to precisely and carefully etch the oxide to expose the active region. However this method surrenders the desirable, self-aligning aspects of the LOCOS procedure simply to counter the field oxide intrusion.

It is therefore evident that there is a need for an improvement in widely-accepted MOS fabrication procedures which will reduce the formation of the field oxide bird's-beak without introducing unnecessary complexity in the standard procedures.

SUMMARY OF THE INVENTION

It is a primary object of this invention to reduce the encroachment of grown field oxide between heterogeneous material layers in a procedure for fabricating MOS integrated electronics.

It is a further object of the invention to provide a method for the reduction of field oxide encroachment in MOS integrated electronics fabrication that incorporates the overcoating of a masking anti-oxidant layer with a layer of passivation material that covers the mask edge and a portion of the semiconductor substrate on which the mask is deposited.

These and further objects are realized in accordance with the invention by depositing a layer of passivation material over the anti-oxidant material layer which is used to define an active element area on the surface of a semiconductor substrate. The passivation material is deposited on top of the anti-oxidant masking layer before the masking pattern is formed. After deposition of the passivation layer, the element pattern mask is placed on the passivation material and the passivation and anti-oxidation layers are simultaneously etched down to a pad oxide layer covering the substrate surface to form the masking pattern over the substrate material. Next, the passivation material is heated to a semi-molten state in which it flows over the edge of the anti-oxidant material layer mask and onto the pad oxide over the semiconductor substrate's surface in a region immediately abutting the mask.

Following the passivation layer reflow step, the field doping and field oxidation steps are performed. The passivation layer overflow spaces the doped field region away from the edge of the masking layer so that, during growth of field oxide, diffusion of the field-doped region beneath the defined active element surface area of the semiconductor substrate is retarded. Further, the overflow reduces the encroachment of grown field oxide layer between the mask layer and the defined active element area of the semiconductor substrate surface.

As will be apparent from the detailed description of the invention, the passivation layer overflow also accomplishes other objects and provides further advantages which can be appreciated when the detailed description is read together with the accompanying drawings.

BRIEF DESCRIPTION OF THE DRAWINGS

FIG. 3 represents the culmination of the series of process steps in which a layer of anti-oxidant material and an overlayer of passivation material are formed into a pattern mask defining an active element area on a portion of semiconductor substrate material.

FIG. 4 represents the results of steps subsequent to those summarized in FIG. 3 in which the overlayer of passivation material is reflowed over the edge of the masking anti-oxidant layer to protect the edge of the layer from field oxide encroachment and to prevent excessive diffusion of field impurities into the defined active area.

FIG. 5 represents the results obtained with the method of the invention before the passivation and antioxidant layers are removed for active device formation.

FIG. 6 represents the reduction in field oxide encroachment resulting from the process of the invention.

DETAILED DESCRIPTION OF THE PREFERRED EMBODIMENT

Figure 1:
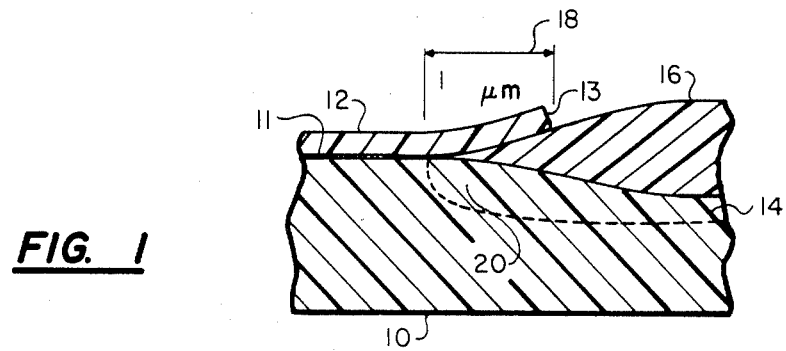
FIG. 1 is a cross-section of a portion of a wafer of semiconductor substrate material showing the encroachment of a portion of a field oxide layer between a layer of masking material and the semiconductor substrate surface as well as the diffusion of a doped field region beneath the masking layer.

Referring now to FIG. 1, a problem of self-aligned MOS manufacturing technology on which the invention focuses is illustrated. In the well-known LOCOS (localized oxidation of silicon) process that is widely employed for the manufacture of MOS devices, a wafer of silicon semiconductor substrate material has grown on it a relatively thin layer of pad oxide 11 followed by a deposition of an anti-oxidant material, such as silicon nitride which is etched with a photo-lithographic process into a pattern mask defining an active area of the surface of the substrate 10 in which the source, drain, and channel regions of an MOS transition will later be formed.

After the anti-oxidant masking layer 12 has been grown and etched into the desired active area mask, a region of field impurities 14 is formed in the field region of the substrate 10 which lies outside of the active area defined by the layer 12.

After the field doping step, a relatively thick layer of field oxide 16 is grown on the exposed areas of the surface of the substrate 10 that are not covered by the mask; the anti-oxidant material constituting the mask resists growth of the oxide over the active element region. At the edges of the anti-oxidant layer, one of which is indicated by 13, the field oxide laterally diffuses in the shape of the thin edge 12 of wedge which partially lifts the layer edge 13 from the surface of the substrate 10. The tapered wedge-like region of the field oxide is commonly referred to as a bird's beak. As indicated by the arrow 18, the bird's beak can extend up to one micrometer, on an edge, past the layer edge 13 and over the active area defined by the layer 12.

Further, as is known, the length of the field oxidation growth cycle permits the forward edge 20 of the field impurity region 14 to diffuse underneath the masking layer edge 12 into the active area.

With reference now to FIGS. 2-6, an improvement to the convention MOS fabrication technique represented in FIG. 1 will be described. While the description is phrased in terms of a p-type silicon semiconductor substrate, it should be understood that the process can be adapted to other types of semiconductor materials. Further, FIGS. 3-5 illustrate but a single active element area on a semiconductor substrate. As is known, a single substrate is intended to include a great many such areas. Therefore, it will be understood that the active area illustrated is representative of a great many more such areas and the process of preventing encroachment in the illustrated area can also be utilized in the other active areas as well. The drawings are not to scale and the dimensions have been exaggerated where it is necessary or helpful to illuminate an aspect of the method of the invention.

Figure 2:
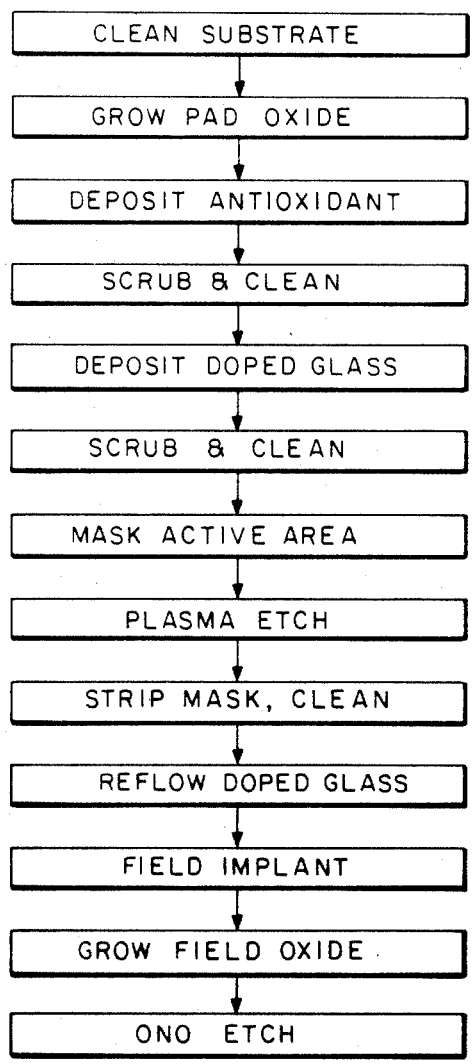
FIG. 2 is a process diagram which includes the method of the invention.

Referring now to FIGS. 2 and 3, a semiconductor substrate 30, including starting material consisting of (100) p-type silicon having a resistivity of 25-45 ohms per centimeter is initially cleaned. Next a pad oxide layer 32 of approximately 1,000 angstroms's thickness is grown on the surface of the substrate 30 using a wet oxide growth step. Following growth of the pad oxide, a layer of anti-oxidant material, preferably silicon nitride ($Si_3N_4$) is grown to a thickness of approximately 1,500 angstroms. The layer of nitride is scrubbed and cleaned and a layer of passivation material comprising arsenic, boron or phosphorus-doped glass is deposited on the anti-oxidant layer to a thickness of from 10,000 to 15,000 angstroms. The doped glass layer is scrubbed and cleaned and a photolithographic mask of positive photoresist (not shown) is deposited on the doped glass layer to define an active element area for the silicon substrate 30 in which an active element such as a MOS transistor is later to be fabricated.

The portion of the doped glass and silicon nitride layers which are not under the mask are etched away using a standard plasma etching process. This operation leaves a stratified island underneath the photoresist mask which includes a masking layer 34 of silicon nitride material whose edges 34a and 34b define the outer perimeter in the active element area of the underlying silicon substrate 30 that is masked by the layer 34. A stratum 36 of phosphorus-doped glass caps the stratum 34. Next, the photoresist mask is stripped from atop the stratum 36, whih results in the structure illustrated in FIG. 3.

FIGS. 2 and 4 should now be referred to in order to further understand the method of the invention. As is known, a material such as the phosphorus-doped glass constituting the layer 36 will begin to flow when heated to a temperature which is determined by the portion of dopant in the glass. For example, for a glass which is doped with a phosphorus concentration of 8 percent, the material of the layer 36 will flow at approximately 1025° C. As is known, the material layers 32 and 34 and the substrate 30 all flow at substantially higher temperatures. Therefore, the structure of FIG. 30 can be subject to an ambient temperature sufficient to cause the layer 36 alone to become partially molten so that it flows over the edges 34a and 34b of the anti-oxidant material layer 34 which remains solid. Hereinafter, this step is referred to as "reflowing" of the layer 36.

As is shown in FIG. 4, after it has been heated to its reflow temperature, the layer 36 includes a pair of skirts 36a and 36b which cover the edges 34a and 34b of the layer 34 and the surface portions 32a and 32b of the pad oxide layer 32 in the vicinity of the edges of the layer 34. Although not provided, a plan view of the FIG. 4 structure would show that a continuous skirt, including the sections 36a and 36b, flows over the continuous edge of the masking layer 34 and covers the surface of the pad oxide 32 in the immediate neighborhood of the anti-oxidant material layer periphery.

In the next step, an ion-implantation procedure (represented by the downward-pointing arrows) is used to dope regions 38 and 40 of the substrate 30 with field impurities. During the implantation step, the skirts 36a and 36b block the ion beam and keep the edges 38a and 40a of the field implant regions spaced laterally outward from the edges 34a and 34b of the anti-oxidant material layer 34.

Next, a relatively thick (7,000-10,000 angstroms) layer of field oxide is grown employing a wet oxide growth process, resulting in the oxide layer 42 and 44. As is customary, during the field oxidation growth step, the forward edges 38a and 40a of the field implant regions diffuse toward the layer 34. In addition, the field oxide layers exhibit small encroachments 42a and 44a under the edges 34a and 34b, respectively of the anti-oxidant layer.

Finally, an ONO (oxide-nitride-oxide) etching step is employed to selectively etch the layers 36 and 34 and the portion of the pad oxide remaining beneath the layer 34. Preferably, the ONO etching step includes, first, etching the phosphorus-doped glass layer 36 with a 10:1 solution of HF for a period of a time sufficient to remove all of the layer 36. Next, the layer 34 is removed by exposure to a bath of hot phosphoric acid, following which the remainder of the pad oxide 32 is removed by a standard buffered HF etching process.

The result after the ONO etching step is illustrated in FIG. 6 where the exposed active element area 46 is bounded by a pair of small field oxide encroachments 42a and 44a. By using the process of passivation layer reflow illustrated in FIG. 4, the inventor has been able to limit the encroachments 42a and 44a to about 0.35 microns per side when the layers 42 and 44 have remaining thicknesses of approximately 4660 angstroms.

It should be evident from the above-described method that a significant reductions of the bird's-beak encroachment and field dopant diffusion are achieved with no extra masking steps added to the standard LOCOS process.

Although described with reference to specific materials and steps, it should be evident that modification to the above method are possible. For example, the pad oxide layer can be eliminated, with the silicon nitride being deposited directly on the surface of the substrate 30. Further, the doped glass layer 36 can comprise one of a variety of dopants including arsenic or boron-phosphate that flow at selectable reflow temperatures. In addition, the thickness of the nitride layer 34 can be increased at the same time that that of the passivation layer 36 is held constant or decreased. In any case, specific considerations of a particular manufacturing process should dictate a precise combination of materials and dimensions which would, nonetheless, not depart from the spirit of the invention.

Manifestly then, many modifications and variations of the described invention are possible in light of the above teachings. It is therefore to be understood that within the scope of the appended claims, the invention can be practiced otherwise than as specifically described.

I claim:

1. A method of preparing a partially fabricated semiconductor device, comprising the steps of:
    depositing a layer of anti-oxidant material over the surface of a semiconductor substrate;
    depositing, on said anti-oxidant layer, a layer of doped glass passivating material;
    defining an element pattern on said passivating layer;
    etching away the portions of said passivating and antioxidant material layers not contained in said pattern to expose the portion of said substrate surface not contained in said pattern and to form a stratum of said anti-oxidant material layer over said substrate beneath said pattern;
    heating the remainder of said passivating layer to a temperature at which a portion of said remainder flows to cover an edge of said stratum and a portion of said exposed substrate surface adjacent said edge; and
    growing, over the remainder of said exposed substrate surface portion, a relatively thick layer of field oxide material which abuts said flowed passivating layer portion.

2. The method of claim 1 further including, after said heating step, field doping said substrate.

3. The method of claim 1 further including, after said field oxide growth, removing the remainder of said passivating material and anti-oxidant layers for fabrication of a device in the portion of said substrate surface lying substantially beneath said pattern.

4. The method of claim 3 further including, after said heating step, field doping said substrate.

5. The method of claim 1 wherein said anti-oxidant material includes silicon nitride.

6. The method of claim 1 wherein said passivating material includes glass doped with a material chosen from the group consisting of phosphorus, boron, and arsenic.

7. A method for reducing field oxide and field doping encroachment into an active area of a semiconductor substrate during the fabrication of an active device in said active area, said method comprising the steps of:
    masking said active area with a pattern including a layer of anti-oxidant material deposited over said substrate surface and a layer of doped glass passivating material layer formed over said anti-oxidant layer;
    flowing said passivation to cover both said anti-oxidant layer and a region of said substrate surface adjacent, but not covered by said anti-oxidant layer;
    growing, over the portion of said substrate surface not covered by said anti-oxidant and passivation layers, a layer of oxide material.

8. The method of claim 7 further including, after said flowing step, the step of forming a field-doped region in said substrate.

9. The method of claim 8 further including, afteer said oxide growth step, removing said passivating material and anti-oxidant layers to expose said active area for formation of an active device therein.

10. The method of claim 9 further including the step of forming an active device in said active area.

* * * * *